United States Patent [19]

Ito et al.

[11] Patent Number: 4,697,074
[45] Date of Patent: Sep. 29, 1987

[54] THERMALLY IMPROVED PHOTODETECTOR HAVING A ROUGHENED, RECESSED, RAISED OR INCLINED LIGHT RECEIVING SURFACE

[75] Inventors: Kazuo Ito, Habikino; Toshiyuki Kudo, Hirakata; Ritsuo Hama, Osaka, all of Japan

[73] Assignee: Sanyo Electric Co., Ltd., Osaka, Japan

[21] Appl. No.: 807,562

[22] Filed: Dec. 11, 1985

[30] Foreign Application Priority Data

Dec. 17, 1984 [JP] Japan .............................. 59-191049[U]
Dec. 17, 1984 [JP] Japan .............................. 59-191050[U]
Feb. 12, 1985 [JP] Japan .............................. 60-18248[U]

[51] Int. Cl.$^4$ ............................................. H01J 40/14
[52] U.S. Cl. .................................... 250/211 R; 250/216
[58] Field of Search ................. 250/211 J, 211 R, 201, 250/216, 227, 239, 551, 578; 369/44, 45, 46

[56] References Cited

U.S. PATENT DOCUMENTS

| 3,639,770 | 2/1972 | Zizelmann | 250/551 |
| 3,842,263 | 10/1974 | Kornrumpf et al. | 250/227 |
| 3,859,536 | 1/1975 | Thiel | 350/96.1 |
| 3,891,858 | 6/1975 | Schöberl | 250/551 |
| 4,124,860 | 11/1978 | Johnson | 250/551 |
| 4,227,078 | 10/1980 | Yamamoto et al. | 250/551 |
| 4,237,382 | 12/1980 | Thillays | 250/551 |

Primary Examiner—David C. Nelms
Assistant Examiner—S. Allen
Attorney, Agent, or Firm—Armstrong, Nikaido, Marmelstein & Kubovcik

[57] ABSTRACT

A photodetector comprising a photocell assembly including a substrate and at least one photocell formed on the substrate and having a light receiving face. The photocell assembly is completely embedded in a transparent resin molded body which has a light receiving surface defined therein so as to permit an incoming light incident thereupon to travel direct to the light receiving face of the photocell. The light receiving surface is roughened, recessed, raised, or inclined.

6 Claims, 26 Drawing Figures

THERMALLY IMPROVED PHOTODETECTOR HAVING A ROUGHENED, RECESSED, RAISED OR INCLINED LIGHT RECEIVING SURFACE

BACKGROUND OF THE INVENTION

The present invention generally relates to a photodetector and, more particularly, to the photodetector suited for use as an optical pick-up head for optically recording or reproducing information on or from an optical information carrier medium.

An optical video disc system is nowadays well-known wherein information recorded on an optical information carrier medium, for example, a video disc, is optoelectrically reproduced. In general, the optical video disc system makes use of an optical pick-up head and a laser as a source of light to be eventually detected by the pick-up head.

Figure 7:
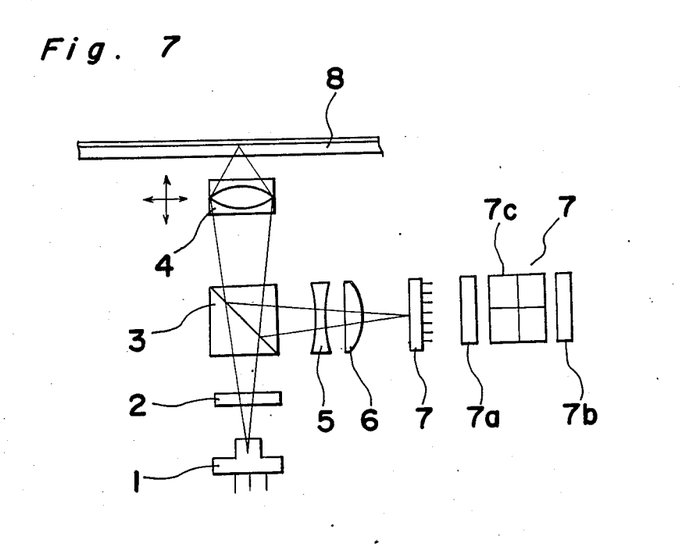
FIG. 7 is a schematic diagram showing the popular optical head system.

FIG. 7 of the accompanying drawings illustrates a popular example of optical pick-up head system, wherein reference numerals 1, 2, 3, 4, 5, 6, 7 and 8 represent a semiconductor laser, a diffraction grating, a beam splitting prism, an objective lens assembly, a concave lens, a cylindrical lens, a photodetector, and a video disc, respectively. A tracking control system used therein is a three-beam tracking control system, wherein a tracking error signal can be detected by a pair of photocells 7a and 7b for tracking purpose formed in the photodetector 7. On the other hand, a focus control system is an astigmation system, wherein a focusing error signal can be detected by a four-segment photocell 7c. An information (RF) signal can be detected by the four-segment photocell 7c.

Figure 8:
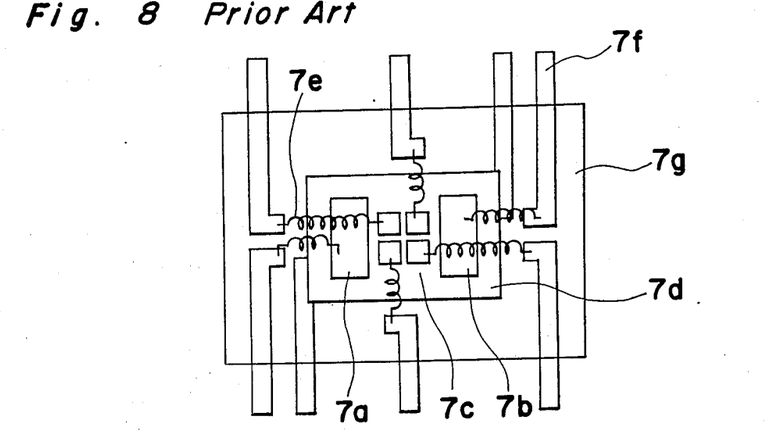
FIG. 8 is a schematic top plan view of the conventional photodetector.
Figure 9:
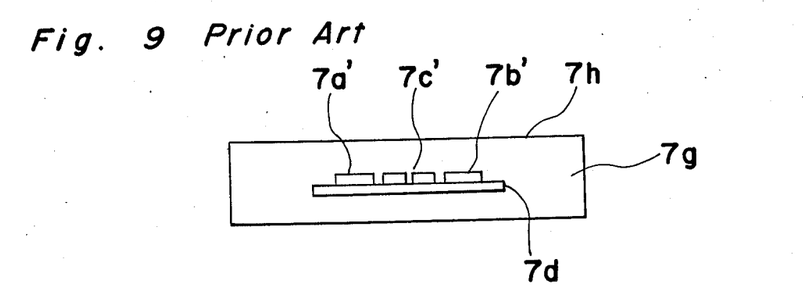
FIG. 9 is a schematic side view of the conventional photodetector shown in FIG. 8.

In this type of optical pick-up head, the photodetector 7 is of a type formed by molding a synthetic resin, for example, transparent epoxy resin, the structure of which is shown in FIGS. 8 and 9. As shown therein, the photodetector 7 comprises a substrate 7d on which the photocells 7a, 7b and 7c are formed, lead wires 7e feeding respective outputs from the photocells, and output terminal members 7f for connecting the photocells with external circuit wirings, all of said substrate 7d, the lead wires 7e and portions of the terminal members 7f being embedded in a molded transparent resin layer 7g. Built-in functional units are arranged at a substantially central portion of the molded resin with respective light receiving faces 7a', 7b' and 7c' of the photocells held parallel to a light receiving surface 7h of the resin layer 7g.

Figure 10:
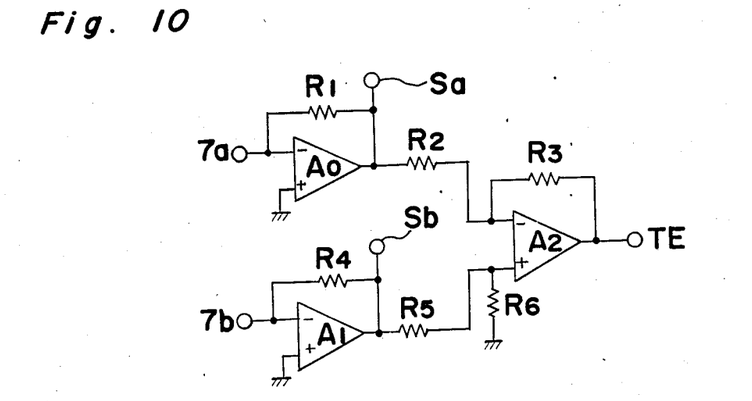
FIG. 10 is a circuit diagram showing a tracking signal processing circuitry.
Figure 11A:
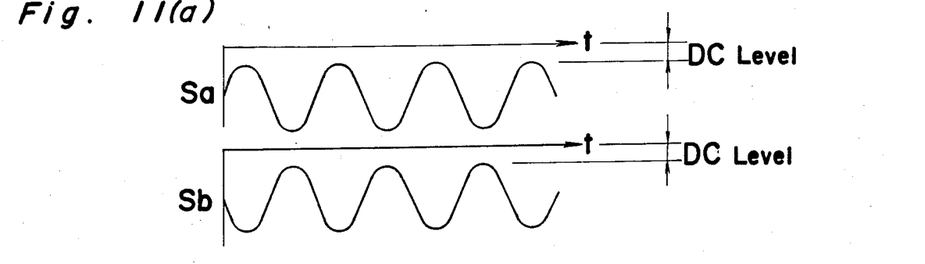
FIGS. 11(a) and 11(b) are diagrams showing the waveforms of signals appearing in the circuit of FIG. 10, respectively.
Figure 11B:
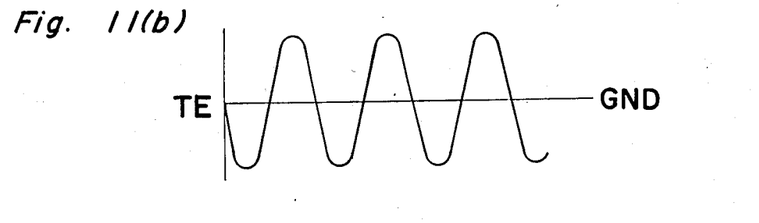

Outputs (currents) from the associated photocells 7a and 7b for tracking purpose are converted into respective voltages by a tracking signal processing circuitry shown in FIG. 10. The tracking error signal is obtained from a subtracting circuit A2 by subtracting the respective outputs of the photocells 7a and 7b. More specifically, assuming that the outputs (outputs after having been amplified) of the photocells 7a and 7b are expressed by Sa and Sb, respectively, a tracking error signal component TE can be expressed by $TE=Sb-Sa$. It is to be noted that, in FIG. 10, reference characters A0 and A1 represent amplifiers, FIG. 11(a) illustrates the respective waveforms of the outputs Sa and Sb, whereas FIG. 11(b) illustrates the waveform of the tracking error signal. Normally, an intermediate point (½ of the value P-P) of the TE signal does not coincide with the GND level because of conditions of an optical system as well as the difference in DC level of the outputs Sa and Sb and also in output level, and for compensating for a deviation of the intermediate point by means of a circuit, either the resistance R4 or R1 or the resistance RG or R3 is adjusted to bring the intermediate point into coincidence with the GND level.

However, since a tracking servo is apt to function to bring the intermediate point into coincidence with the GND level in the event of deviation occurring between the intermediate point and the GND level, it will have an offset in a tracking direction when the deviation exceeds a predetermined quantity, and in this case the servo will no longer function.

Figure 12:
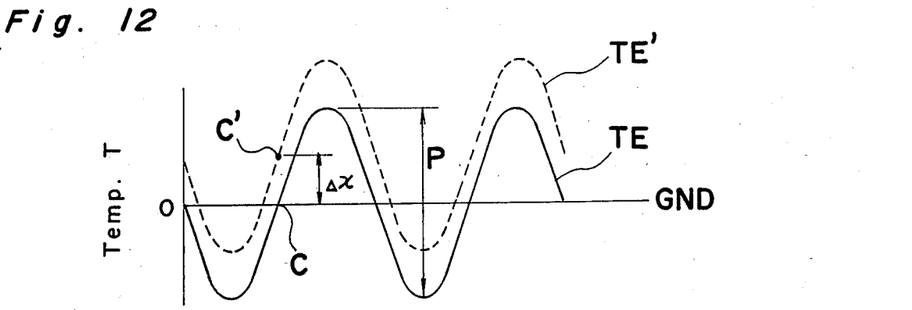
FIGS. 12 and 13 are diagrams showing temperature-dependent characteristics of tracking error signals, respectively.

The above described conventional optical pick-up head has a problem in that, since it often happens that the tracking error signal changes with change in temperature to such an extent that a serve circuit can no longer function its control, the tracking operation tends to become unstable. FIG. 12 illustrates a temperature-dependent change of the tracking error signal, and as shown therein, the tracking error signal TE once adjusted at normal temperature undergoes a change with change in temperature T and, at a certain temperature, displaces to a position shown by TE'. In this connection, assuming that the amplitude of the tracking error signal is expressed by P and the displacement of an intermediate point C of the amplitude of the tracking error signal is expressed by $\Delta x$, and when the rate of change $\alpha(=(\Delta x/P)\times 100\%)$ attains a value higher than 10%, the tracking serve tends to become unstable.

Figure 13:
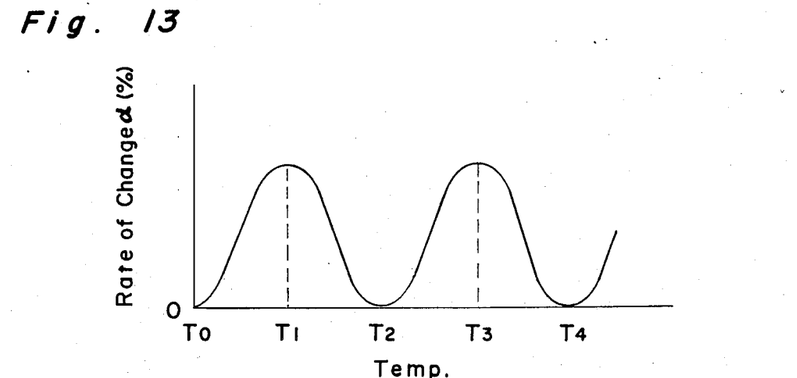

FIG. 13 illustrates the temperature dependent characteristic of the rate of change $\alpha$ in the conventional optical pick-up head, and it has been found that the change rate $\alpha$ often attains 15 to 20% at maximum and, moreover, the change rate $\alpha$ varies in swelling fashion at a predetermined interval of temperature, for example, by the effect of a temperature difference of 10° to 15° C. In FIG. 10, where the initial adjustment has been done at normal temperature in which case the change rate $\alpha$ is, as a matter of course, zero (because the intermediate point coincides with the GND level and the value $\Delta x$ is therefore zero), the change rate $\alpha$ attains a peak value at a temperature 10° to 15° C. higher than the normal temperature. Accordingly, at a temperature as high as the temperature at which the change rate $\alpha$ exceeds 10%, the tracking operation tends to become unstable.

It has been found that the above described problem has resulted from the interference of light which is attributable to the change in optical path induced by the change in temperature. The interference of light is paramount particularly in the photodetector, occupying 70 to 80% of all the change rate.

Figure 14:
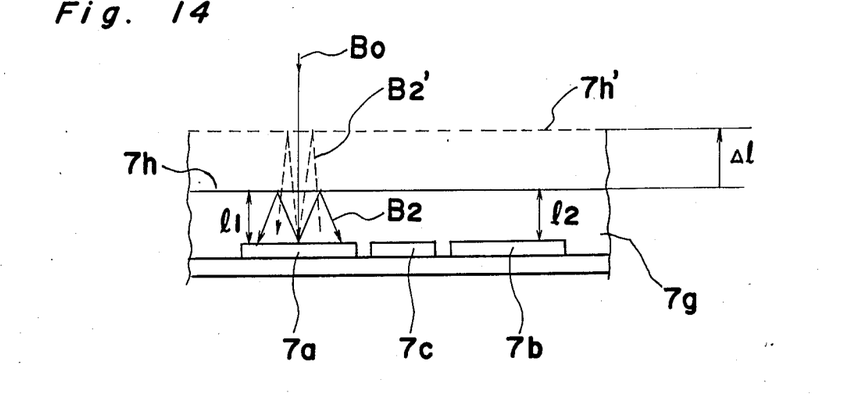
FIG. 14 is a schematic side view of a photodetector used to explain the interference of light.

FIG. 14 is a diagram used to explain how the light interference occurs as a result of difference in optical path, and a beam B0 of light for tracking purpose enters the light receiving surface 7h of the molded resin layer and is subsequently detected by the photocell 7a. Assuming that the position of the light receiving surface of the molded resin layer is located at a level 7h at the time the position and the intensity of the incident beam have been initially adjusted at normal temperature, and when the temperature has increased to a value higher than the normal temperature by a predetermined value, the molded resin layer undergoes a thermal expansion with the light receiving surface consequently shifted to a position shown by 7h'.

Let it be assumed that the distance between the light receiving face of the photocell 7a and the light receiving surface 7h is expressed by l1, and the distance between the light receiving surfaces 7h and 7h' (attributable to the thermal expansion of the molded resin layer) is expressed by Δl. The incident beam B0 after having impinged upon the light receiving face of the photocell 7a is partially reflected therefrom towards the light receiving surface of the molded resin layer as shown by B2 or B2', and when and after the distance Δl has attained a value which brings about the interference of light, the reflected light interferes with the incoming incident beam B0 producing a pattern of dark and bright fringes on the light receiving face of the photocell 7a.

It is well known from the theory of interference of light that, when two light beams from the same light source and, hence, of the same wavelength λ travel along respective optical paths of different distance having a path difference of half the wavelength λ, a pattern of alternate dark and bright bands or fringes is produced.

Accordingly, the interference occurs when the relationship expressed by the following equation is satisfied:

$$2(l1 + \Delta l) = n \cdot \lambda/2 \quad (1)$$

wherein n is a positive integer other than 0. Referring to the photocell 7a shown in FIG. 14, when $n=2m$ and $n=2m+1$ (wherein m is a positive integer), the interference of bright fringes and that of dark fringes occurs, respectively. In other words, in the case where the amount of change Δl in thickness continuously varies with change in temperature, the interference of the dark and bright fringes alternating at intervals of a quarter wavelength is produced with the consequence that the photocell 7a generates a DC current of varying level.

The description similar to that set forth above in connection with the photocell 7a can be equally applicable to the photocell 7b particularly when the relationship expressed by the following equation is satisfied:

$$2(l2 + \Delta l) = n \cdot \lambda/2 \quad (1)$$

However, because of the resin molded product the distances l1 and l2 do not become equal to each other in view of the fact that each value of the distances l1 and l2 is in the order of submicorn, and, therefore, it often occurs that the phase of the interference occurring in one of the photocells 7a and 7b does not match with that of the other of the photocells 7a and 7b. More specifically, assuming for the sake of brevity that no interference of light occurs in the photocell 7b, the following relationship will be established:

$$\Delta TE_{DC} \approx k \cdot (7a)_{DC} \quad k: \text{constant}$$

and, as shown in FIG. 13, the rate of change α attributable to the varying level of the DC current produced from the photocell 7a will vary. Assuming that, in FIG. 13, the bright tringes and the dark fringes are produced at respective temperatures T1 and T2, the change in temperature from the value T1 to the value T2 results in the change in the value Δl in a quantity corresponding to the fourth of the wavelength λ as can be understood from equation (1). The graph of FIG. 13 applies where the thickness of the resin molded layer having a coefficient of thermal expansion which is $5.2 \times 10^{-5}$° C. is 600 μm and the wavelength λ of the laser beam is 800 nm. In view of the fact that the value Δl per increase of 1° C. is: $\Delta l = 600 \times 5.2 \times 10^{-5} \approx 31$ nm, and will be equal to one fourth of the wavelength λ when the temperature increases about 6° C., it coincides with the result of experiments which show that the half cycle (T1→T2) corresponds to the temperature increase of 5° to 7.5° C.

Where the distances l1 and l2 above the respective photocells 7a and 7b embedded in the resin molded layer has the following relationship:

$$l1 \sim l2 = (2m+1) \cdot \lambda 4$$

the phases of interference are displaced 180° and, accordingly, the change rate α or $TE_{DC}$ attains a maximum value.

In an attempt to substantially obviate the above discussed problems inherent in the conventional device, Japanese Laid-open Utility Model Publication No. 56-157762, laid open to public inspection 1981, has proposed to use a light reflecting film on the surface of the resin molded product. However, it has been found problematic in that a complete bond between the film and the resin surface cannot be achieved without difficulty and, also, the heat treatment used to form the film often results in the deterioration (for example, reduction in light transmissivity) of the resin molded body.

SUMMARY OF THE INVENTION

The present invention has been developed with a view to substantially eliminating the above described disadvantages and inconveniences and has for its essential object to provide an improved photodetector wherein means is incorporated to minimize the temperature-dependent change of the tracking error signal.

This and other objects of the present invention can be accomplished by providing the resin molded body having a light receiving surface inclined at a predetermined angle relative to the light receiving face of at least one photocell embedded in the resin molded body.

According to another embodiment of the present invention, the light receiving surface of the resin molded body is finely roughened to have a multiplicity of alternating hills and dates parallel to each other. According to a further embodiment of the present invention, however, a portion of the light receiving surface of the resin molded body which is in register with the photocell embodded therein is offset in level from the plane in which the remaining portion of the light receiving surface lies, i.e., either concaved or convexed.

All of these embodimehts of the present invention have been developed to accomplish a common objective of minimizing the determintal interference of light to be received by the photocell. More specifically, where the light receiving surface of the resin molded body is inclined relative to the light receiving face of the photocell, a primary reflected light B1, i.e., light reflected by the light receiving face of the photocell towards the inclined light receiving surface of the resin molded body, is again reflected by the inclined light receiving surface of the resin molded body to form a secondary reflected light B2 without substantially travelling towards the light receiving face of the photocell. Accordingly, the undesirable intereference of light between the incoming incident light carrying information and the secondary reflected light B2 can advantageously be minimized. This in turn brings about the minimized change in intensity of light falling on the light receiving face of the photocell, and therefore, any possible change in tracking error signal can be suppressed when the photodetector constructed according to the present invention is used to detect the tracking error signal.

Where the light receiving surface of the resin molded body is roughened or offset, the secondary reflected light can be scattered and, therefore, the amount of light reflected back towards the light receiving face of the photocell can be minimized, with the consequent minimization of the above described interference of light.

BRIEF DESCRIPTION OF THE DRAWINGS

This and other objects and features of the present invention will become clear from the following description taken in conjunction with preferred embodiments thereof with reference to the accompanying drawings in which like parts are designated by like reference numerals and in which.

DETAILED DESCRIPTION OF THE EMBODIMENTS

Figure 1:
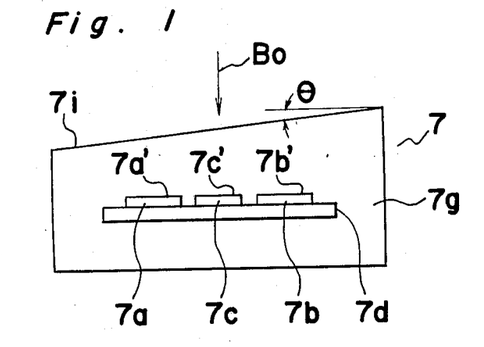
FIG. 1 is a schematic side view of a photodetector according to a first embodiment of the present invention.
Figure 2:
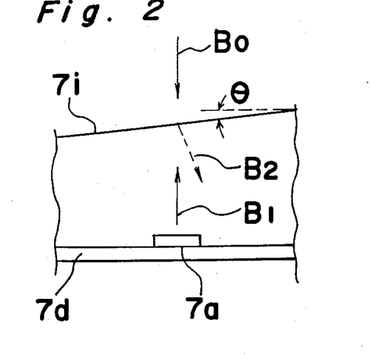
FIG. 2 is a side view, on an enlarged scale, of a portion of the photodetector shown in FIG. 1.

Referring first to FIGS. 1 and 2, a photodetector 7 shown therein comprises a photocell assembly including a substrate 7d with photocells 7a, 7b and 7c formed on one surface of the substrate 7d, the photocell assembly being completely embedded in a transparent resin molded body 7g of generally cubical configuration. The photocells 7a to 7c have their respective light receiving faces or "windows" 7a', 7b' and 7c' all lying in the same plane, whereas the resin molded body 7g has a light receiving surface 7i so defined and so located as to permit the incoming beam B0 of light to travel direct to the windows 7a' to 7c' of the respective photocells 7a to 7c through such light receiving surface 7i. According to the prior art, the light receiving surface 7i is planar and lies in parallel relation to the plane occupied by the photocell windows 7a' to 7c' as hereinbefore discussed with reference to FIGS. 8 and 9.

According to the present invention, however, the light receiving surface 7i is planar, but is inclined at a predetermined angle $\theta$ relative to the plane occupied by the photocell windows 7a' to 7c', said angle $\theta$ being selected to be within the range of 1.5 to 6 degrees. As a matter of practice, the plane occupied by the photocell windows 7a' to 7c' assumes the right-angled relationship with the direction of travel of the incoming light B0 when and so long as the photodetector 7 is in use.

Where the angle $\theta$ of inclination is smaller than the minimal limit of 1.5°, the amount of light reflected from the light receiving surface 7i towards the photocell windows 7a' to 7c' after having been reflected by the photocell windows 7a' to 7c', that is, the amount of the secondary reflected light B2, will be great and no interference of light discussed hereinbefore can be minimized so much as expected. On the other hand, where the inclination angle $\theta$ is greater than the maximum limit of 6°, the incoming light B0 will be reflected and/or diffracted in an increased quantity to such an extent as to result in the reduced intensity of light falling on the photocell windows 7a' to 7c'.

Figures 3, 4, 5:
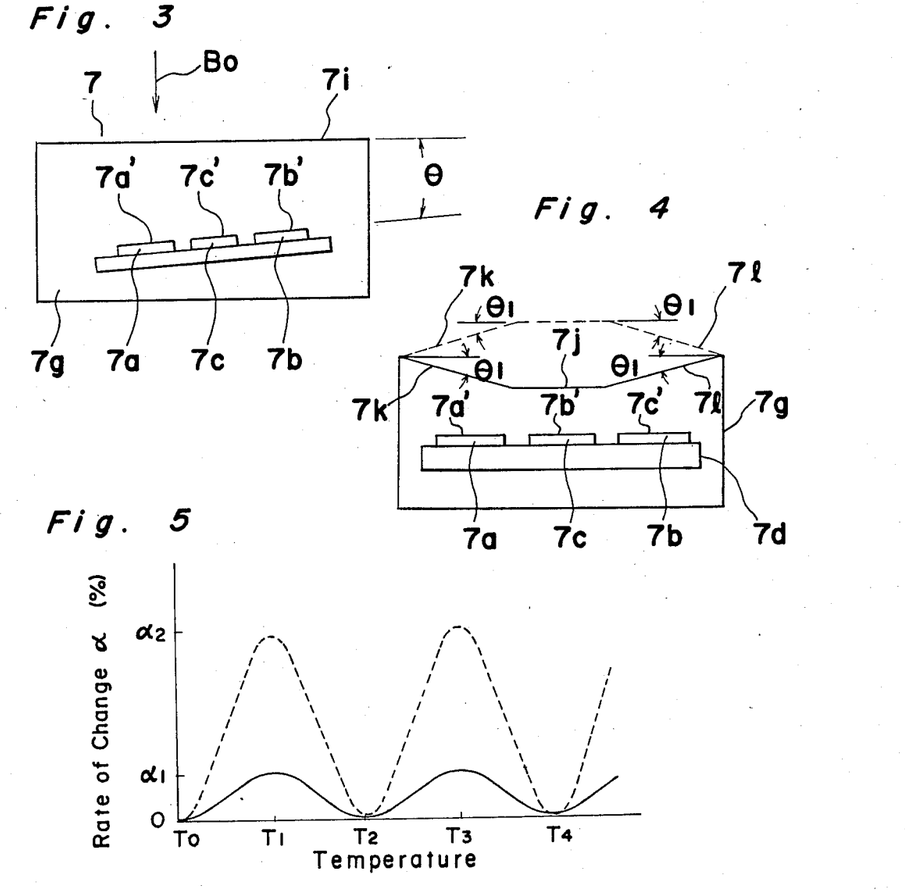
FIGS. 3 and 4 are side views of the photodetector according to second and third embodiments of the present invention, respectively.
FIG. 5 is a graph showing a characteristic of the photodetector according to the present invention.

While in the embodiment shown in FIGS. 1 and 2 the light receiving surface 7i is inclined relative to the plane occupied by the photocell windows 7a' to 7c', the embodiment of the present invention shown in FIG. 3 is such that the photocell assembly is embedded in the resin molded body 7g in an inclined fashion so that the plane occupied by the photocell windows 7a' to 7c' can converge with the light receiving surface 7i at the predetermined angle $\theta$.

In the embodiment shown in FIG. 4, the light receiving surface of the resin molded body 7g is so recessed as to provide an intermediate surface area 7j parallel to the photocell window 7c', and a pair of side surface areas 7k and 7l defined on respective sides of the surface area 7j in register with the associated photocell windows 7a' and 7b' and inclined upwardly therefrom in respective directions away from each other so as to converge at a predetermined angle $\theta 1$ with a plane parallel to any one of the surface area 7j and the photocell windows 7a' to 7c'. Alternatively, as shown by the phantom line in FIG. 4, the light receiving surface of the resin molded body 7g may be raised outwardly.

Figure 6:
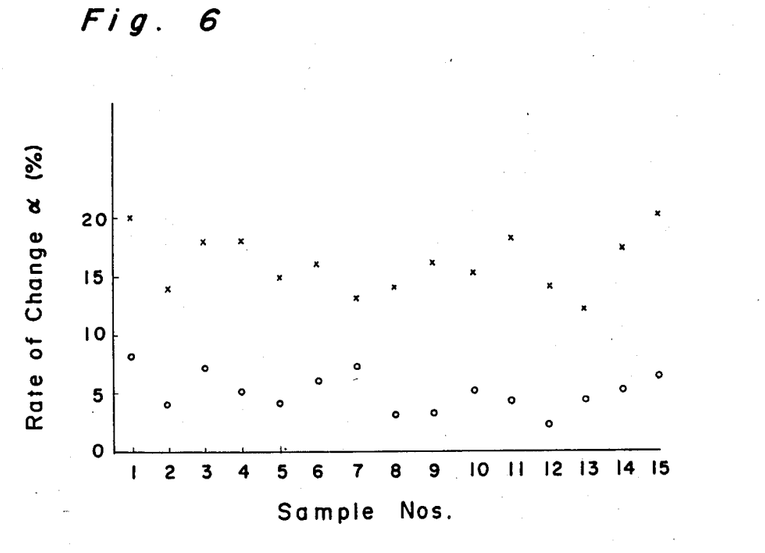
FIG. 6 is a graph similarly showing a characteristic of the photodetector according to the present invention.

FIG. 5 illustrates that when the photodetector constructed as hereinbefore described according to the present invention was used for detecting the tracking error, the rate of change of the photodetector of the present invention has been suppressed to a maximum value of 6 to 7% as shown by the solid line, in contrast to the maximum value of 15 to 20% exhibited by the prior art photodetector as shown by the broken line. FIG. 6 illustrates the rates of change exhibited by samples of photodetectors according to the present invention (shown by small circles) and those according to the prior art (shown by x), and it is clear that the rate of change exhibited by the photodetector according to the present invention is lower than that according to the prior art. All of these results are the outcome of the minimized interference of light as hereinbefore discussed.

Figure 15:
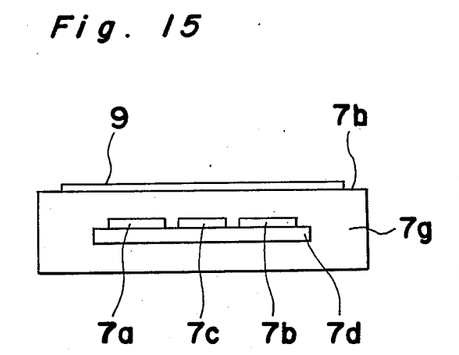
FIG. 15 is a schematic side view of the photodetector according to a fourth embodiment of the present invention.
Figure 16:
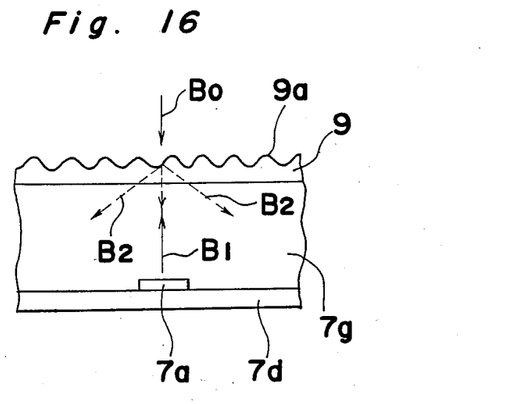
FIG. 16 is a schematic side view, on an enlarged scale, of a portion of the photodetector shown in FIG. 15.

Referring now to FIGS. 15 and 16, the light receiving surface of the resin molded body 7g is covered by a transparent coating 9 for scattering rays of light reflected by the photocell windows 7a' to 7c' as indicated by B2 in FIG. 16, thereby to minimize the secondary reflected light.

A material for the transparent coating 9 is preferred to be a moldable transparent resin of the same quality as the material for the resin molded body 7g or of a quality capable of exhibiting excellent adhesion or bond with the resin body 7g. Examples of the material for the coating 9 include, for example, an epoxy resin, a UV curable synthetic resin and others. In order to minimize a loss of light which would occur as the incoming beam passes through the coating 9, the coating 9 should be as thin as possible, preferably not greater than 100 μm in thickness. The coating 9 may be formed by the use of any suitable method, provided that such method is effective to render one of the opposite surfaces of the coating 9 remote from the resin molded body 7g to be roughened as shown by 9a in FIG. 16. Such method may include, for example, a spray coating method or a painting method which is to be practiced while the photodetector is oscillated.

Figure 17:
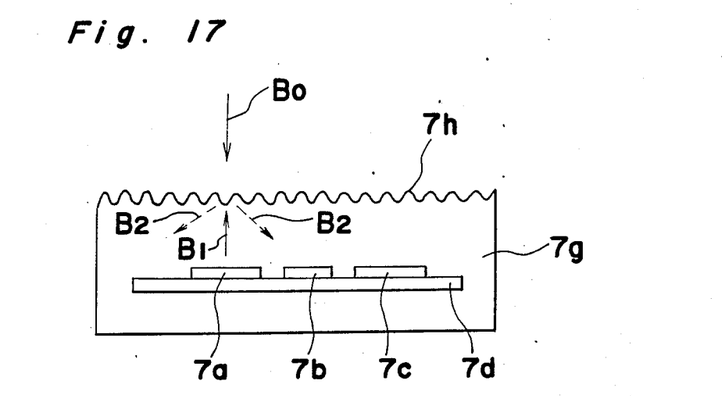
FIG. 17 is a schematic side view of the photodetector according to a fifth embodiment of the present invention.

In the embodiment shown in FIG. 17, however, the light receiving surface 7h of the resin molded body is roughened so as to have a plurality of alternating hills and dales extending parallel to each other. This can be readily accomplished by the use of a mold assembly having a portion of the mold cavity so patterned as to produce the roughened light receiving surface 7h.

Figure 18:
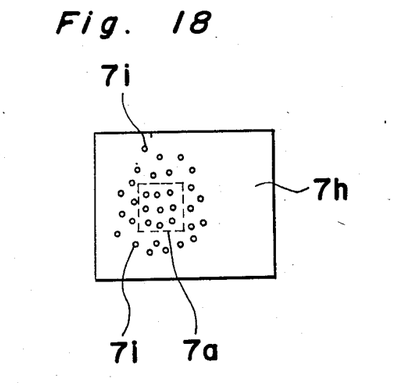
FIG. 18 is a schematic top plan view of the photodetector according to a sixth embodiment of the present invention.
Figure 19:
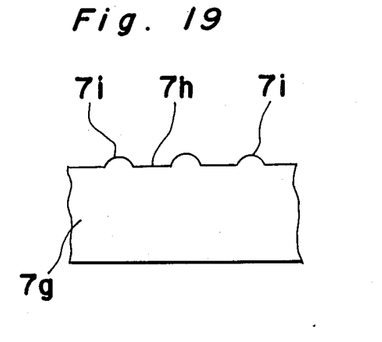
FIG. 19 is a side view, on an enlarged scale, of a portion of the photodetector shown in FIG. 18.

The surface roughening can also be achieved by providing the light receiving surface 7h with a plurality of fine projections 7i as shown in FIGS. 18 and 19, or a plurality of fine recesses. The formation of the fine projections 7i or the fine recesses may be carried out by the use of a sand blasting technique, in which case the sand blasting is preferably followed by a surface treatment such as, for example, an electropolishing or a chemical surface treatment because the sand blasting process lowers the light transmissivity of the light receiving surface 7h. Where the electropolishing or the chemical surface treatment is subsequently employed, it should be practiced to such an extent as to leave surface indentations on the light receiving surface 7h.

The photodetector according to any one of the embodiments shown in and described with reference to FIGS. 15 to 19 has been found exhibiting the same characteristic as shown in and described with reference to FIG. 5.

Figure 20:
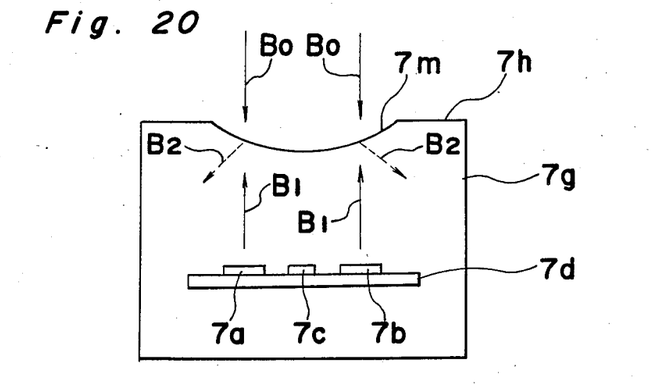
FIG. 20 is a schematic side view of the photodetector according to a seventh embodiment of the present invention.
Figure 21:
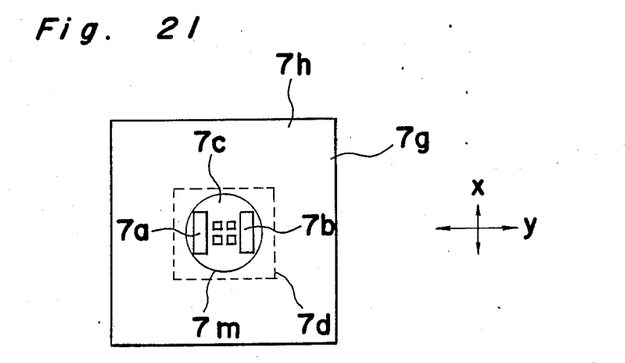
FIG. 21 is a schematic top plan view, on a somewhat reduced scale, of the photodetector shown in FIG. 20.

In the embodiment shown in FIGS. 20 and 21, the light receiving surface 7h is formed with a spherical recess 7m, 50 to 100 μm in depth and 500 to 800 μm in diameter, the diameter being enough to cover all of the photocell windows 7a' to 7c' as best shown in FIG. 21. Instead of the spherical recess shown in FIGS. 20 and 21, a spherical projection, 50 to 100 μm in height and 500 to 800 μm in diameter, may be formed on the light receiving surface 7h.

Figure 23:
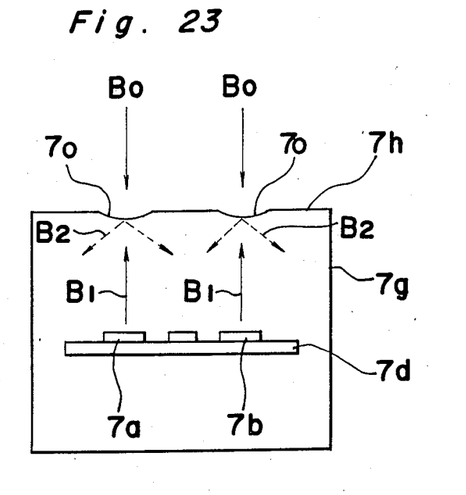
FIG. 23 is a schematic side view of the photodetector according to a ninth embodiment of the present invention.
Figure 24:
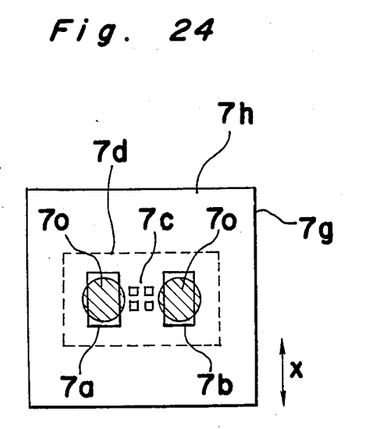
FIG. 24 is a schematic top plan view of the photodetector shown in FIG. 23.

An embodiment of the present invention wherein two spherical recesses 7o are formed on the light receiving surface 7h in register with the photocell windows 7a' and 7b' is shown in FIGS. 23 and 24. Alternatively, spherical projections may be employed in place of the spherical recesses 7o. In either case, each of the spherical recesses 7o or the spherical projections is preferred to have a depth or height within the range of 50 to 100 μm and a diameter within the range of 150 to 170 μm.

In the embodiments shown in and described with reference to FIGS. 20 and 23, if the depth of the or each spherical recess or the height of the or each spherical projection is so selected to have a value greater than 100 μm with the curvature reduced, the or each spherical recess or projection will undesirably act as a lens obstructing the formation of a beam spot of effective size on all of the photocell windows or the associated photocell window.

Figure 22:
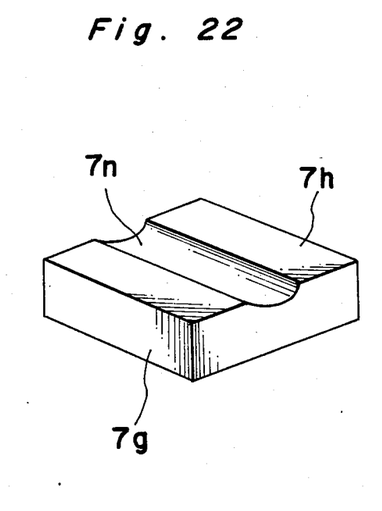
FIG. 22 is a perspective view of the photodetector according to an eighth embodiment of the present invention.
Figure 25:
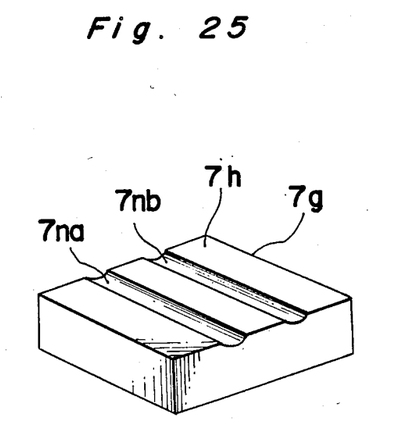
FIG. 25 is a perspective view of the photodetector according to a tenth embodiment of the present invention.

In the embodiment shown in FIG. 22, a straight groove 7n is formed in the light receiving surface 7h of the resin molded body 7g. The direction in which the groove 7n extends may be either a direction shown by x in FIG. 21 or a direction shown by y in FIG. 21. Instead of the groove 7n, a ridge or elongated projection may be formed on the light receiving surface 7h. Yet, two parallel straight grooves 7na and 7nb, or two parallel ridges or elongated projections, may be formed on the light receiving surface 7h so as to extend in a direction shown by x in FIG. 24, as shown in FIG. 25.

In the embodiment shown in and described with reference to FIGS. 22 and 25, the depth or height of the or each groove or ridge is preferred to be within the range of 50 to 100 μm by the reason discussed in connection with the embodiments of FIGS. 20 and 23. With respect to the width of the groove or ridge, it is preferred to be within the range of 500 to 800 μm where the number thereof is one such as shown in FIG. 22, or within the range of 150 to 170 μm each where the number thereof is two such as shown in FIG. 25.

From the foregoing description, it has now become clear that, when the photodetector according to the present invention is used in the pick-up head system, any temperature-dependent change in tracking error signal resulting from the interference of light can advantageously be suppressed and, therefore, the tracking operation can be stabilized.

Although the present invention has been fully described by way of example with reference to the accompanying drawings, it is to be noted here that various changes and modifications will be apparent to those skilled in the art. In the foregoing description, reference has been made to the use of the photodetector in the three-beam tracking control system. However, the concept of the present invention is equally applicable to the one-beam tracking control system wherein a tracking error signal is detected by a four-segment photocell.

Therefore, unless otherwise such changes and modifications depart from the scope of the present invention, they should be construed as being included therein.

What is claimed is:

1. A photodetector for use in an optical head system, comprising:
   a photocell assembly including,
   a substrate, and
   at least one photocell formed on the substrate and having a light receiving face, said photocell assembly being completely embedded in a transparent resin molded body, said resin molded body having a light receiving surface defined thereon so as to permit an incoming light incident thereupon to travel directly to the light receiving face of the photocell, said light receiving surface being inclined at an angle relative to the light receiving face, such that a portion of the incoming light directed onto the light receiving face of the photocell and reflected outwardly toward the light receiving surface is prevented from being reflected by the light receiving surface back to said light receiving face of the photocell.

2. The photodetector of claim 1, wherein the light receiving surface is inclined at an angle within the range of 1.5° to 6°.

3. A photodetector for use in an optical head system, comprising:
   a photocell assembly including,
   a substrate, and
   at least one photocell formed on the substrate and having a light receiving face, said photocell assembly being completely embedded in a transparent resin molded body, said resin molded body having a light receiving surface defined therein so as to permit an incoming light incident thereupon to travel directly to the light receiving face of the photocell, said light receiving surface having a plurality of indentations, such that a portion of the incoming light directed onto the light receiving face of the photocell and reflected outwardly toward the light receiving surface is prevented from being reflected by the light receiving surface back to said light receiving face of the photocell.

4. The photodetector as claimed in claim 3, further comprising a layer of coating formed on the light receiving surface, said indentations being formed on one surface of the coating layer opposite to the light receiving surface.

5. The photodetector as claimed in claim 3, wherein said indentations are formed direct in the light receiving surface.

6. A photodetector for use in an optical head system, comprising:
   a photocell assembly including,
   a substrate, and
   at least one photocell formed on the substrate and having a light receiving face, said photocell assembly being completely embedded in a transparent resin molded body, said resin molded body having a light receiving surface defined therein so as to permit an incoming light incident thereupon to travel directly to the light receiving face of the photocell, said light receiving surface being recessed or raised, such that a portion of the incoming light directed onto the light receiving face of the photocell and reflected outwardly toward the light receiving surface is prevented from being reflected by the light receiving surface back to said light receiving face of the photocell.

* * * * *